(12) United States Patent
Fujimori et al.

(10) Patent No.: US 9,535,135 B2
(45) Date of Patent: Jan. 3, 2017

(54) METHOD FOR CALCULATING SOLAR RADIATION AMOUNT AND METHOD FOR DETERMINING POWER TO BE SUPPLIED

(71) Applicant: Hitachi, Ltd., Chiyoda-ku, Tokyo (JP)

(72) Inventors: Masaaki Fujimori, Tokyo (JP); Tohru Kohno, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 531 days.

(21) Appl. No.: 14/075,362

(22) Filed: Nov. 8, 2013

(65) Prior Publication Data

US 2014/0136131 A1    May 15, 2014

(30) Foreign Application Priority Data

Nov. 14, 2012   (JP) ................................. 2012-249829

(51) Int. Cl.
 *G01R 31/40*   (2014.01)
 *G01R 21/133*   (2006.01)
 *H02S 50/10*   (2014.01)

(52) U.S. Cl.
 CPC ............. *G01R 31/405* (2013.01); *H02S 50/10* (2014.12)

(58) Field of Classification Search
 CPC ............................... G01R 31/405; H02S 50/10
 USPC ..... 702/60, 61; 454/251, 254; 126/597, 621, 126/628; 363/95, 98, 132; 323/299, 906
 See application file for complete search history.

(56) References Cited

U.S. PATENT DOCUMENTS

| | | | | |
|---|---|---|---|---|
| 5,892,354 | A * | 4/1999 | Nagao ....................... | G05F 1/67 323/299 |
| 6,046,919 | A * | 4/2000 | Madenokouji ............ | G05F 1/67 323/906 |
| 6,080,927 | A * | 6/2000 | Johnson ..................... | F24J 2/07 126/562 |
| 7,677,243 | B2 * | 3/2010 | McClendon .......... | F24F 5/0046 126/597 |
| 8,729,445 | B2 * | 5/2014 | Kelly ......................... | H02J 1/14 126/572 |
| 9,310,533 | B2 * | 4/2016 | Angelini ................... | G02B 5/10 |
| 2008/0176504 | A1 * | 7/2008 | McClendon .......... | F24F 5/0046 454/251 |
| 2010/0000522 | A1 * | 1/2010 | Zahuranec ................ | F24J 2/07 126/696 |

(Continued)

FOREIGN PATENT DOCUMENTS

JP        2003-121558 A      4/2003
JP        2010-249608 A      4/2010

(Continued)

*Primary Examiner* — Carol S Tsai
(74) *Attorney, Agent, or Firm* — Crowell & Moring LLP

(57) ABSTRACT

A method for calculating a solar radiation amount is provided, which enables the prediction of a solar radiation amount with consideration also given to the small movement of a cloud that affects a power generation amount generated by a PV array and thereby improves the accuracy of prediction of the power generation amount generated by the PV array. From a measured output value of a solar panel, solar radiation and a temperature parameter are extracted. An output of a PV is calculated from the extracted solar radiation and temperature parameter. The calculated value is correlated with the measured value. A temperature correction coefficient is obtained so that a correlation coefficient is highest, and a solar radiation amount is calculated using the obtained correlation coefficient.

2 Claims, 6 Drawing Sheets

(56) References Cited

U.S. PATENT DOCUMENTS

| | | | | |
|---|---|---|---|---|
| 2010/0006139 A1* | 1/2010 | Zahuranec | ............... | F24J 2/07 136/246 |
| 2013/0100548 A1* | 4/2013 | Angelini | ............... | G02B 5/10 359/853 |
| 2013/0175862 A1* | 7/2013 | Kelly | ............... | H02J 1/14 307/24 |
| 2014/0049772 A1* | 2/2014 | Zollars | ............... | G01S 3/784 356/138 |
| 2015/0073737 A1* | 3/2015 | Inuzuka | ............... | H02S 50/10 702/61 |

FOREIGN PATENT DOCUMENTS

| | | |
|---|---|---|
| JP | 2012-124188 A | 6/2012 |
| JP | 2012-160498 A | 8/2012 |

\* cited by examiner

METHOD FOR CALCULATING SOLAR RADIATION AMOUNT AND METHOD FOR DETERMINING POWER TO BE SUPPLIED

CROSS-REFERENCE TO RELATED APPLICATION

This application claims the priority of Japanese Patent Application No. 2012-249829 filed Nov. 14, 2012, which is incorporated herein by reference in its entirety.

BACKGROUND OF THE INVENTION

1. Field of the Invention

The present invention relates to a solar radiation amount calculation technique that calculates a solar radiation amount using an output of a solar panel.

2. Description of the Related Art

Energy management systems (EMSs), each of which is an energy control system as a part of a power system, are sorted according to the type and scale of a management target. The EMSs are classified into a home EMS (HEMS) targeted at a home, a building EMS (BEMS) targeted at a building, a factory EMS (FEMS) targeted at a factory, and a community EMS (CEMS) targeted at a community. The CEMS controls, as targets, a HEMS, a BEMS, and a FEMS within a target area, grasps a required power amount, gives an EMS as a control target a command to suppress energy consumption, and grasps the supply amount of power from the outside, thereby performing flexible and dynamic energy management.

In thermal power generation and nuclear power generation that utilize fossil, fuel (coal, oil, natural gas, oil sand, shale gas, or methane hydrate) or underground resources such as uranium as exhaustible energy, since the fuel and resources can be stored, a power generation amount is hardly affected by a power generation environment (weather and the like) (operation is conducted not to be affected). However, renewable energy (sunlight, wind power, wave/tidal power, flowing water/tides, geothermal heat, biomass, or the like), especially solar photovoltaic power generation (PV) that has been rapidly increasing in recent years is greatly affected by the natural environment, which may cause the system to be unstable. Therefore, energy management to improve the prediction accuracy of a solar power generation amount and thereby stabilize the system is required of CEMSs in the future.

As methods for solving this problem, there are three methods disclosed in JP-A-2010-249608 (Patent Document 1), JP-A-2012-124188 (Patent Document 2), and JP-A-2003-121558 (Patent Document 3). In the method of Patent Document 1, regional solar radiation amount and meteorological data are obtained from the outside to estimate a solar radiation amount, and a power generation amount of a PV array according to the solar radiation amount is predicted. In the method of Patent Document 2, a PV array power generation amount is predicted by comparing time-series data of the PV array power generation amount. In the method of Patent Document 3, a solar radiation amount is calculated from PV array power generation data acquired from a PV array, and the solar radiation amount is provided as weather information.

The method of Patent Document 1 needs an actinometer installed in the region and a device for acquiring the regional meteorological data from the outside. Therefore, extra cost is incurred for installing an EMS. Moreover, since the installation environment of a PV array varies depending on the tilt and shape of a roof, a great difference is generated between the values of individual PV arrays and the measured value of the regional actinometer. Hence, the prediction accuracy of the power generation amount generated by the PV array according to the solar radiation amount is also lowered.

On the other hand, the method of Patent Document 2 can predict a power generation amount at low cost without using another device. However, since only the comparison of fluctuation patterns of the time-series data is performed, an error in prediction of power generation amount is great. Especially, the method cannot cope with the formation or disappearance of a cloud.

The method of Patent Document 3 does not need to install a device other than a PV array, and therefore, a study was conducted to calculate the hours of sunlight using this method and predict a power generation amount by combining the method of Patent Document 1 without adding measuring instrument or acquiring additional data.

Actually, however, except for a sunny day, solar radiation changes sharply in terms of time on a day with a cloud, and a spike-like change is rapidly repeated in a short time. Therefore, when the prediction of solar radiation is performed using the solar radiation of the cloudy day as it is, the predicted value of power generation amount also rapidly increases or decreases repeatedly. When interpolation or extrapolation is performed based on such a spiky measured or predicted value and the prediction horizon is extended, the obtained result is also a spiky result, which increases an error in prediction.

In the related art in which other measured data is not used as described above, it is impossible to measure a solar radiation amount with consideration also given to the small movement of a cloud that affects a power generation amount generated by the PV array. Therefore, the accuracy of prediction of the power generation amount generated by the PV array is low.

SUMMARY OF THE INVENTION

It is an object of the invention to enable the prediction of a solar radiation amount with consideration also given to the small movement of a cloud that affects a power generation amount generated by a PV array.

The present application includes a plurality of means for achieving the object, and the representative examples thereof will be shown below.

That is, a method of correcting a solar radiation amount was devised in which a measured power value acquired from a PV panel, a solar radiation amount calculated from the measured power value, a PV array temperature, and a calculated power value calculated from the obtained solar radiation amount and the array temperature are used.

The correcting method of a solar radiation amount is a method of determining a temperature correction coefficient used in making a power calculation so that a correlation between the measured power value and the calculated power value is highest, and calculating the solar radiation amount using the coefficient.

According to the invention, it is possible to predict a solar radiation amount with consideration also given to the small movement of a cloud that affects a power generation amount generated by a PV array. Therefore, the prediction accuracy of the power generation amount generated by the PV array is improved, so that a CEMS can precisely perform energy management on an EMS as a control target.

DETAILED DESCRIPTION OF THE INVENTION

Hereinafter, embodiments of the invention will be described.

Embodiment 1

Figure 1:
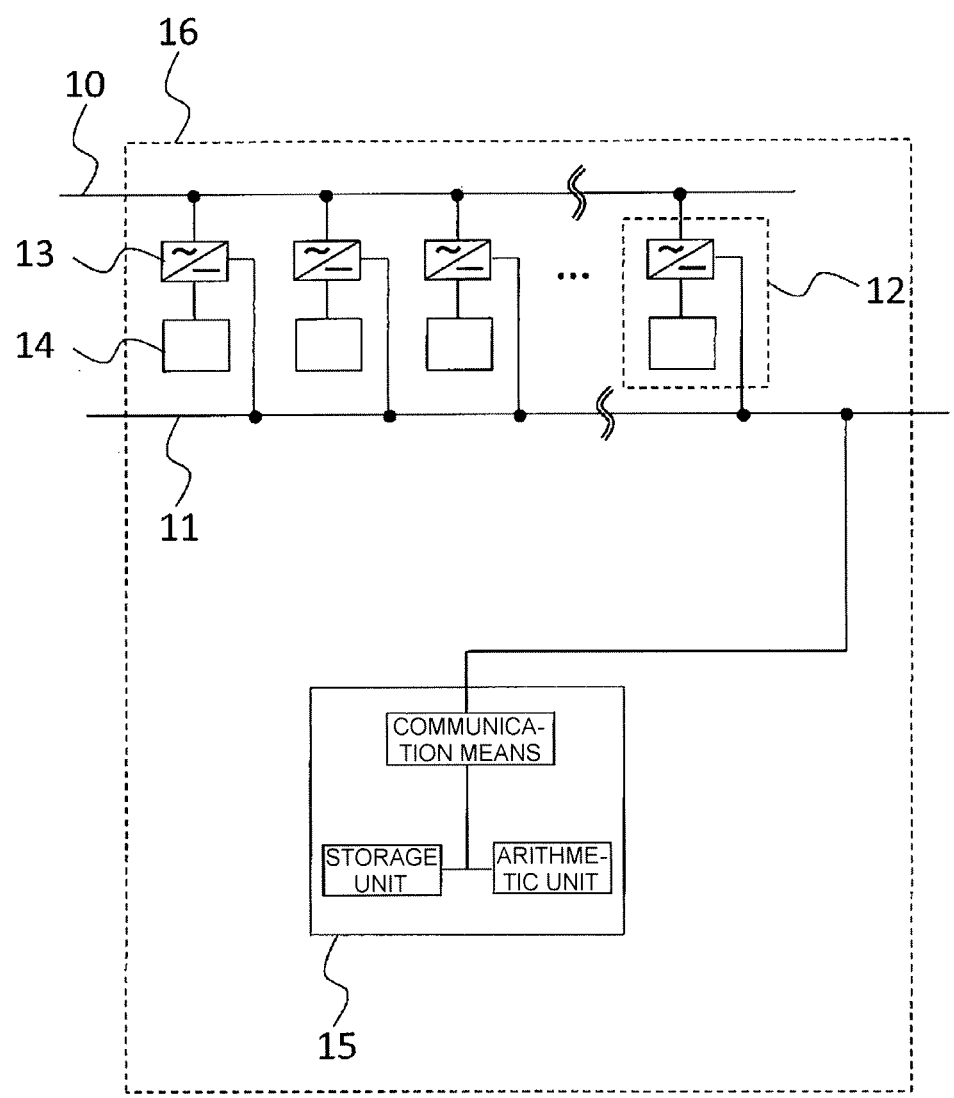
FIG. 1 shows a PV (solar photovoltaic power generation) system and a CEMS that records and processes a power generation amount in the PV system.

FIG. 1 shows a PV system and a CEMS that records and processes a power generation amount in the PV system. The PV system is composed of a power conditioner 13 and a PV array 14. EMS units 12 each including the PV system are interconnected to a power system line 10 via the power conditioners 13.

Each of the EMS units 12 is arranged corresponding to a home (HEMS), a building (BEMS), or a factory (FEMS), and is interconnected to the power system line 10. The power value generated by the PV array is output from the power conditioner of each of the EMS units 12, and transmitted to a communication line 11.

An information processor 15 is connected to the communication line 11. The information processor 15 collects, via the communication line 11, the power value generated by the PV array and output from the power conditioner 13 of the EMS unit 12, and stores the value in a storage unit. The information processor 15 collects the power values generated in the EMS units 12 within an area 16 on which the information processor 15 performs energy management as a CEMS. As the area 16, a range that is easy to control, such as a town or a city, may be appropriately set.

Figure 2:
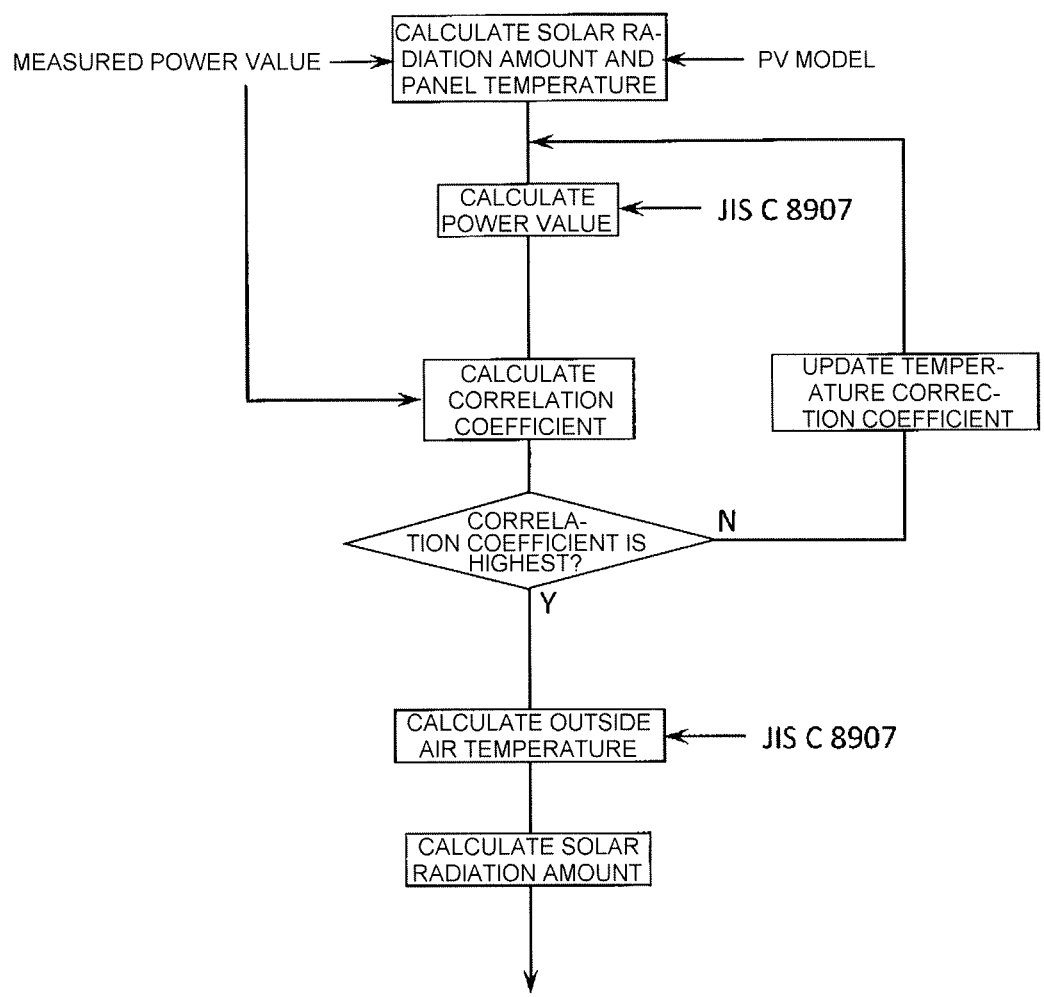
FIG. 2 is a processing flow of an information processor of the CEMS.

The information processor 15 is arranged in each CEMS. The information processor 15 calculates a solar radiation amount, from which the influence of a cloud is removed, in the PV array connected to the system (FIG. 2). First, a solar radiation amount p and a PV array operation temperature Ta at the position of each of the PV systems are calculated from the power value generated by the PV system and stored in the storage unit of the information processor. For the calculation, a method of using a PV model disclosed in JP-A-2012-160498 is utilized. According to this method, the solar radiation amount and the array operation temperature can be extracted from the power value generated by the PV array. However, by setting initial parameters using initial characteristic values described in specifications of the PV arrays or the certificate of inspection, the solar radiation amount and the operation temperature can be obtained with accuracy. Therefore, the initial parameters are stored in the storage unit as initial values of each of the PV arrays.

Figure 3A:
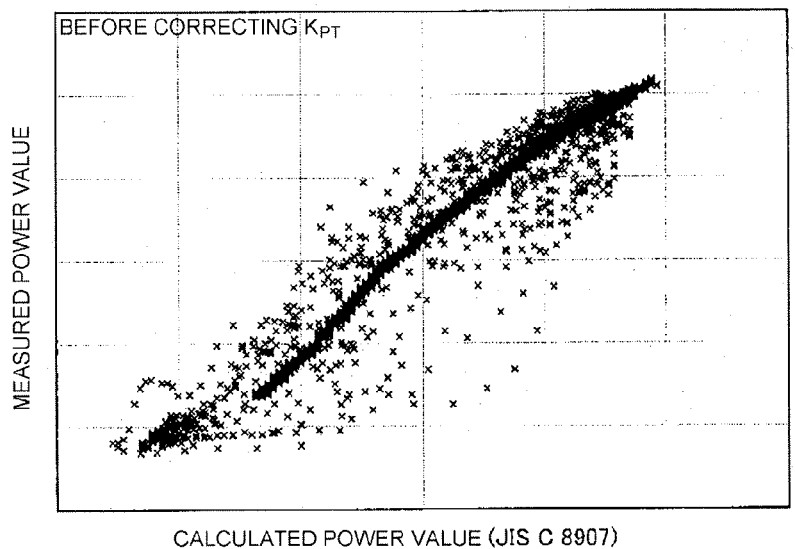
FIG. 3A is an exemplary graph of a correlation between measured and calculated power values before correcting a temperature correction coefficient used for a power calculation.
Figure 3B:
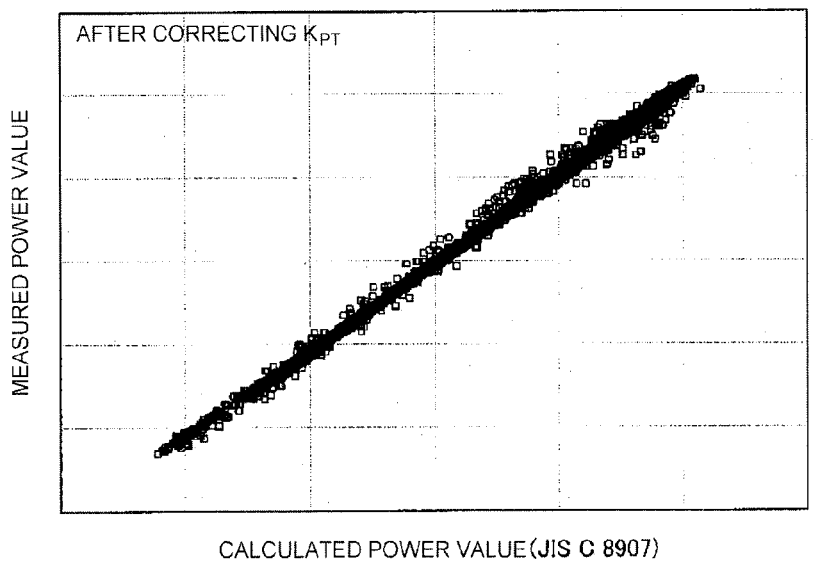
FIG. 3B is an exemplary graph of a correlation between measured and calculated power values after correcting the temperature correction coefficient used for the power calculation.
Figure 4A:
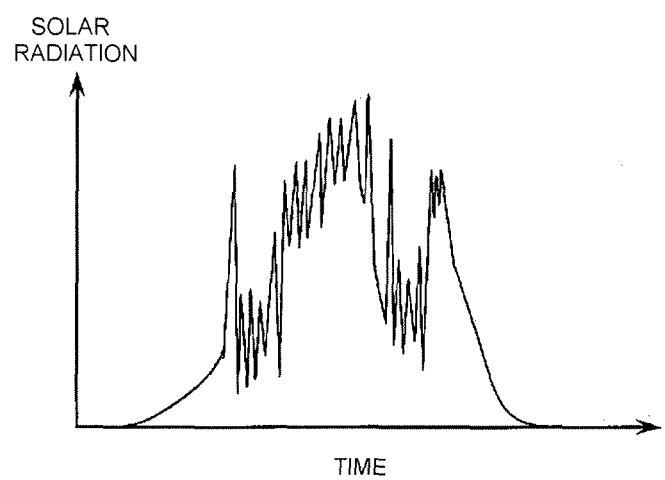
FIG. 4A is a graph schematically showing a spiky temporal change in solar radiation intensity due to the influence of a cloud.
Figure 4B:
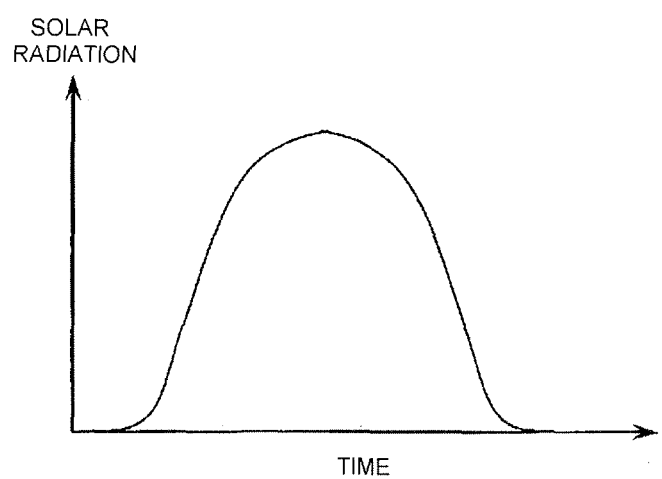
FIG. 4B is a graph schematically showing a gradual temporal change in solar radiation intensity after removing the influence of a cloud.

By using the calculated solar radiation amount and the calculated operation temperature, an output of each of the PV arrays can be calculated. Herein, a power generation amount is calculated by Expression (1) according to JIS C 8907.

$$\text{Power generation amount} = PV \text{ rated output} \times P_{SN} \times K_{HD} \times K_{PD} \times K_{PT} \times K_{PM} \times K^{PA} \times K_{IN} \times K_{AC} \quad (1)$$

where $P_{SN}$ is a solar radiation amount, $K_{HD}$ is a solar radiation amount annual fluctuation correction coefficient, $K_{PD}$ is a temporal change correction coefficient, $K_{PT}$ is a temperature correction coefficient, $K_{PM}$ is an array load matching correction coefficient, $K_{PA}$ is an array circuit correction coefficient, $K_{IN}$ is an inverter circuit correction coefficient, and $K_{AC}$ is an AC line energy transmission efficiency $K_{AC}$. Values designated by JIS are used except for the solar radiation amount and the temperature correction coefficient. The temperature correction coefficient $K_{PT}$ is given by Expression (2).

$$K_{PT} = 1 + \alpha \times (T_A + 18.4 - 25) \quad (2)$$

where $\alpha$ is a maximum output temperature coefficient of a module, and $T_A$ is an air temperature. Calculation is made by assigning the obtained solar radiation amount to $P_{SN}$ and replacing the PV array operation temperature with $T_A+18.4$. The power generation amount obtained by calculation is correlated with the measured power generation amount, and $K_{PT}$ is adjusted so that a correlation coefficient is highest. When making a graph of a correlation between the power generation amount of the PV array calculated using the obtained $K_{PT}$ and the measured value, it is found that a regression line is a straight line having a slope of about 1.0 (refer to FIGS. 3A and 3B). An outside air temperature can be obtained from this $K_{PT}$ according to JIS C 8907. An outside air temperature obtained from a $K_{PT}$ before correction shows a spiky fluctuation because the solar radiation largely fluctuates under the influence of a cloud and the outside air temperature is affected by the fluctuation. On the other hand, an outside air temperature obtained from a $K_{PT}$ corrected by the above method shows a gradual change. It is known that there is a high correlation between solar radiation and an air temperature. Solar radiation obtained from an air temperature showing a gradual change also shows a gradual change. In this manner, even on a day with rapidly fluctuating solar radiation, it is possible to obtain gradual solar radiation from which the influence of a cloud as a factor of causing the fluctuation of solar radiation is removed (refer to FIGS. 4A and 4B). Moreover, by taking a difference, it is possible to obtain solar radiation with a large fluctuation due to the influence of a cloud. In this method, on the other hand, even if the above procedure is performed in the absence of a cloud, a correct value is obtained for the solar radiation amount.

The above method includes the process of comparing the measured value of power generated and the calculated value of power generated to obtain a correlation coefficient. Therefore, since it is necessary to use a plurality of measuring points and calculation points, data is acquired for a certain period, a calculation point is obtained for a plurality of measuring points, and a correlation coefficient is calculated. The period for which a plurality of data points are acquired may be set to any period.

Embodiment 2

Figure 5:
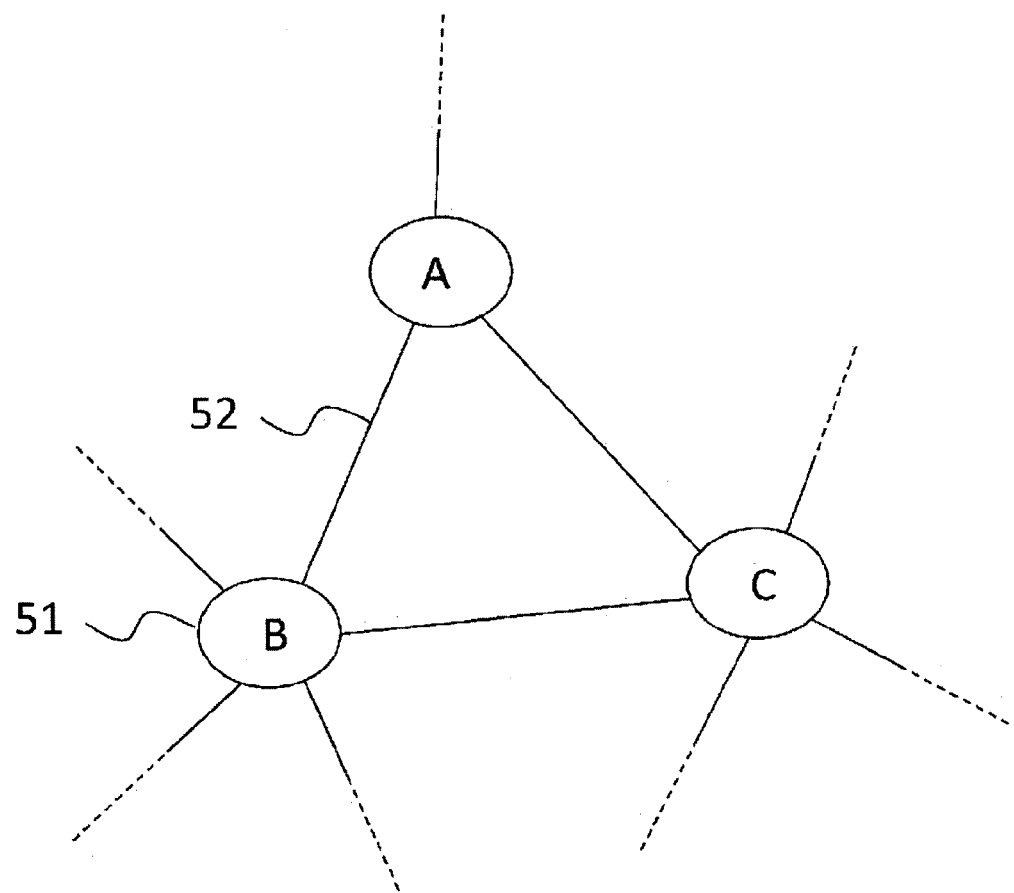
FIG. 5 is a schematic view representing an exemplary connection status of power lines or power lines and communication lines of communities each including a PV array or a PV.

In Embodiment 2, the case of interpolating data using the solar radiation amount obtained according to Embodiment 1 will be described. The case of obtaining solar radiation at midpoints between A, B, and C shown in FIG. 5 is considered. A solar radiation amount is obtained at all the points of A, B, and C by the method described in Embodiment 1. When A, B, and C each include a number of PV arrays as in a community, a solar radiation amount is first calculated for each of the PV arrays in each of the regions A, B, and C, and using the solar radiation amounts, a solar radiation amount distribution within the community is previously obtained. If a planar solar radiation distribution is obtained for each of A, B, and C, those data can be used for the prediction at the midpoints, so that interpolation with higher accuracy can be performed. With the use of these values, a solar radiation amount at the midpoint is interpolated by an existing method. When clouds hang over all of the points A, B, and C, and therefore, it is presumed that a cloud also exists at the midpoints, interpolation is performed using both the solar radiation fluctuating due to the influence of a cloud and the solar radiation from which the influence of a cloud is removed, which are obtained in Embodiment 1.

On the other hand, the case of predicting a solar radiation amount at the point A using information at the points B and C is considered. Also in this case, similarly, a correction of a solar radiation amount is performed at the points B and C, and thereafter, extrapolation of the point A is performed by any method. When A, B, and C are communities, a solar radiation amount at the point A can be predicted with the information of B and C. Also in this case, planar solar radiation distributions at B and C are obtained, and the solar radiation at A is predicted from the distributions by any extrapolation method. In the above description, an interpolation or extrapolation method and a prediction method are not specifically designated. Interpolation, extrapolation, and prediction can be performed using any method.

Embodiment 3

Figure 6:
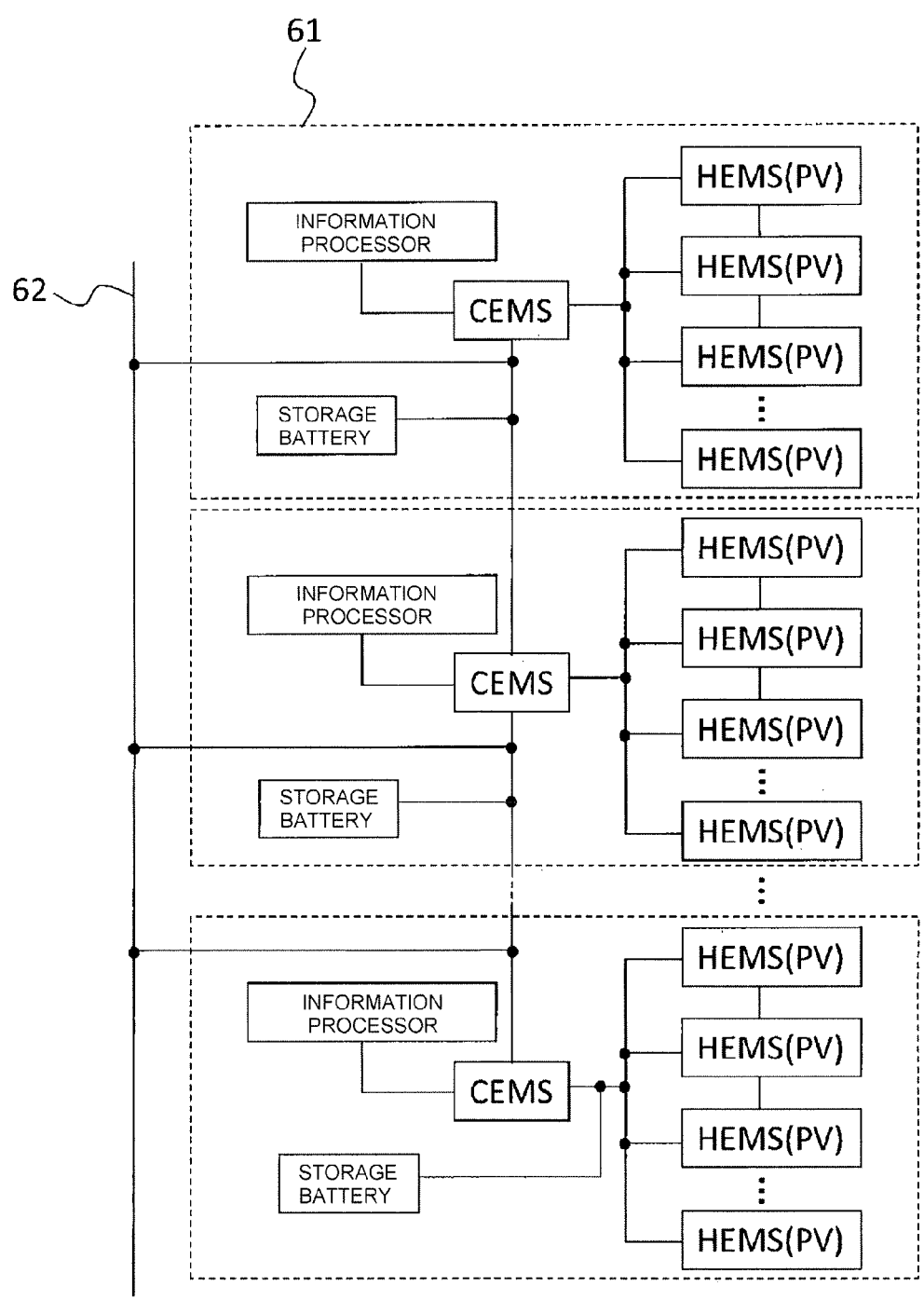
FIG. 6 is a diagram schematically representing the configuration of HEMSs each including a PV for configuration, CEMSs each controlling the HEMSs, and information processors each collecting PV data, and a state of them connected to each other.

In embodiment 3, an example of applying the methods described in Embodiment 1 and Embodiment 2 to energy management will be described. A PV output of each of HEMSs located within a management range of one CEMS, where the range is indicated by the reference 61 in FIG. 6, is taken in the information processor. In the information processor, a solar radiation amount at a site of each of the HEMSs is calculated by the method described in Embodiment 1. Similarly, a solar radiation amount at each of HEMSs is calculated also in an adjacent CEMS. Solar radiation in a third CEMS adjacent to these two CEMSs is predicted by the method described in Embodiment 2. In response to the information, the third CEMS determines to use system power, use storage battery, or instruct each HEMS to increase or decrease a power consumption amount.

A solar radiation amount is calculated from PV outputs connected to HEMSs within a certain CEMS control range, and a solar radiation amount distribution within the region is obtained. This distribution is obtained every certain period. From the time variation, an output after a certain length of time is predicted. According to the prediction, power supply from the system, a storage battery output, supply-demand control over the HEMSs, and the like are planned.

Energy management is not necessarily performed between CEMSs. For example, a solar radiation amount is calculated from PV outputs connected to HEMSs within a certain CEMS control range, and thereafter, prediction of a PV power generation amount is performed using a publicly known solar radiation fluctuation predicting method. With the prediction, the CEMS may adjust a balance between energy supply and demand within the control range.

The storage battery for energy adjustment connected to each CEMS is not necessarily restrictive, and may be other power-generating facilities such as of renewable energy, cogeneration, and thermal power.

What is claimed is:

1. A method for calculating a solar radiation amount, comprising an information processor collecting a power value generated by a photovoltaic (PV) array and output from a power conditioner of an emergency management system (EMS) unit, and storing the power value in a storage unit for:
    calculating a first solar radiation amount and a panel temperature based on a measured power value of a solar panel;
    calculating a first temperature correction coefficient;
    calculating a power value of the solar panel based on the first solar radiation amount, the panel temperature, and the temperature correction coefficient;
    calculating a correlation coefficient by comparing the measured power value and the calculated power value of the solar panel;
    determining whether the correlation coefficient has a highest value;
    adjusting, based on the determination, the first temperature correction coefficient to a second temperature correction coefficient so that the correlation coefficient has the highest value;
    calculating an outside air temperature based on the panel temperature using the second temperature correction parameter corresponding to the correlation coefficient having the highest value;
    calculating a second solar radiation amount based on the calculated outside air temperature; and
    using the second solar radiation amount to perform energy management on an EMS associated with the solar panel.

2. A method for determining power to be supplied to an emergency management system (EMS) comprising an information processor collecting a power value generated by a photovoltaic (PV) array and output from a power conditioner of an EMS unit, and storing the power value in a storage unit for:
    receiving, from the EMS, a measured power value of a solar panel;
    calculating a first solar radiation amount and a panel temperature based on the measured power value of the solar panel;
    calculating a first temperature correction coefficient;
    calculating a power value of the solar panel based on the first solar radiation amount, the panel temperature, and the temperature correction coefficient;

calculating a correlation coefficient by comparing the measured power value and the calculated power value of the solar panel;

determining whether the correlation coefficient has a highest value;

adjusting based on the determination, the first temperature correction coefficient to a second temperature correction so that the correlation coefficient has the highest value;

calculating an outside air temperature based on the panel temperature using the second temperature correction parameter corresponding to the correlation coefficient having the highest value;

calculating a second solar radiation amount based on the calculated outside air temperature; and determining, according to the second solar radiation amount, power to be supplied to the EMS and using the determined power to perform energy management on the EMS.

* * * * *